(12) United States Patent
Yang et al.

(10) Patent No.: US 10,534,276 B1
(45) Date of Patent: Jan. 14, 2020

(54) LITHOGRAPHIC PHOTOMASK ALIGNMENT USING NON-PLANAR ALIGNMENT STRUCTURES FORMED ON WAFER

(71) Applicant: International Business Machines Corporation, Armonk, NY (US)

(72) Inventors: Chih-Chao Yang, Glenmont, NY (US); Hao Tang, Slingerlands, NY (US); Dominik Metzler, Saratoga Springs, NY (US); Cornelius Brown Peethala, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/365,992

(22) Filed: Mar. 27, 2019

(51) Int. Cl.
*G03F 7/20* (2006.01)
(52) U.S. Cl.
CPC ...... *G03F 7/70633* (2013.01); *G03F 7/70625* (2013.01); *G03F 7/70683* (2013.01)
(58) Field of Classification Search
CPC ......... H01L 23/544; H01L 2223/54426; G03F 9/7076; G03F 9/708; G03F 9/7084
See application file for complete search history.

(56) References Cited

U.S. PATENT DOCUMENTS

| | | | |
|---|---|---|---|
| 6,465,897 B1 | 10/2002 | Shih et al. | |
| 6,764,954 B2 | 7/2004 | Diewald et al. | |
| 7,184,853 B2 | 2/2007 | Roberts et al. | |
| 7,223,612 B2 | 5/2007 | Sarma | |
| 7,419,882 B2 | 9/2008 | Wu et al. | |
| 7,442,624 B2 | 10/2008 | Sarma et al. | |
| 7,545,740 B2 | 6/2009 | Zelig et al. | |
| 7,674,717 B2 | 3/2010 | Wang et al. | |
| 7,678,659 B2 | 3/2010 | Tu et al. | |
| 7,795,105 B2 | 9/2010 | Goller et al. | |
| 8,124,319 B2 | 2/2012 | Huang et al. | |
| 8,703,368 B2 | 4/2014 | Lee et al. | |
| 9,905,639 B2 | 2/2018 | Weber et al. | |
| 2005/0101107 A1* | 5/2005 | Ohto | H01L 23/544 438/462 |

(Continued)

FOREIGN PATENT DOCUMENTS

WO 98/57363 A1 12/1998

*Primary Examiner* — Steven Whitesell Gordon
(74) *Attorney, Agent, or Firm* — Vazken Alexanian; Ryan, Mason & Lewis, LLP

(57) ABSTRACT

Techniques are provided for fabricating and utilizing optically opaque non-planar alignment structures in non-die areas (e.g., kerf areas) of a wafer to align photomasks to die areas on the wafer. For example, an insulating layer is formed over non-die and die areas of the wafer. A non-planar alignment feature is formed in the insulating layer in the non-die area. An optically opaque layer stack is formed in the die and non-die areas of the wafer, which conformally covers the non-planar alignment feature to form an optically opaque non-planar alignment structure in the non-die area. A lithographic patterning process is performed to pattern the optically opaque layer stack in the die area, wherein the optically opaque non-planar alignment structure in the non-die area is utilized to align a photomask to the die area. The optically opaque non-planar alignment structure can include any type of non-planar structure having a stepped sidewall surface.

16 Claims, 10 Drawing Sheets

(56) References Cited

U.S. PATENT DOCUMENTS

| | | |
|---|---|---|
| 2016/0093670 A1* | 3/2016 | Jiang .................... H01L 27/222 |
| | | 257/421 |
| 2017/0186695 A1 | 6/2017 | Moser et al. |
| 2018/0158901 A1 | 6/2018 | Weber et al. |
| 2018/0259862 A1 | 9/2018 | Cho |

* cited by examiner

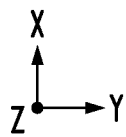
*FIG. 1*
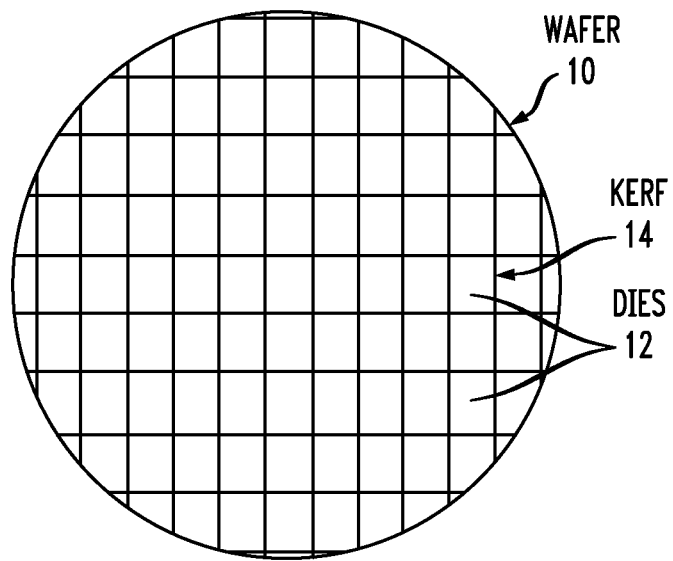
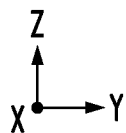
*FIG. 2A*
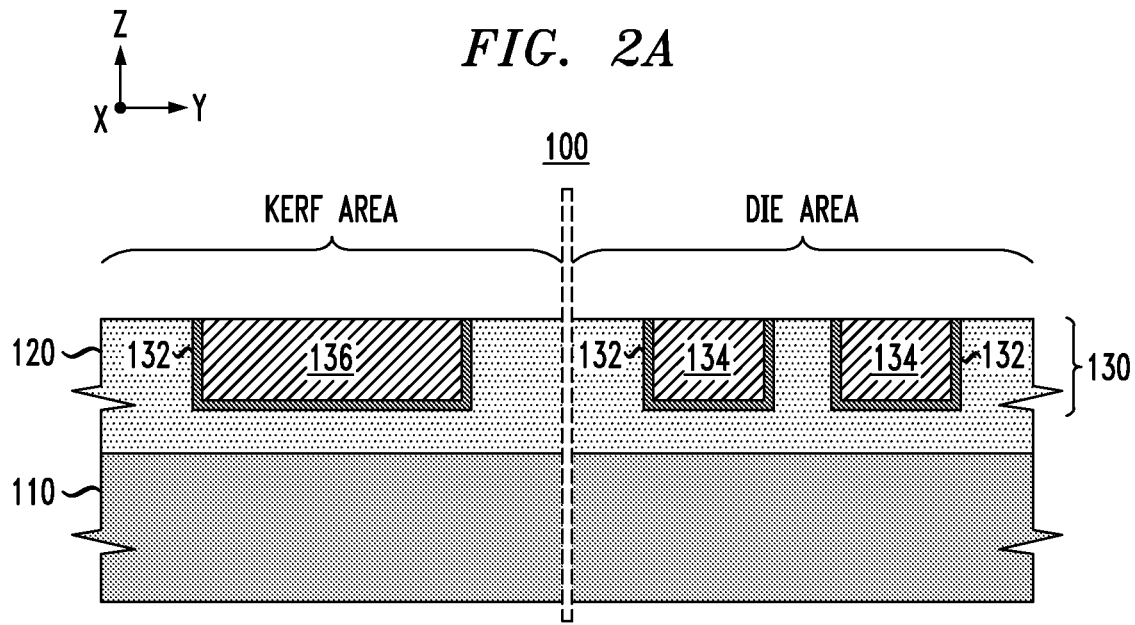

US 10,534,276 B1

LITHOGRAPHIC PHOTOMASK ALIGNMENT USING NON-PLANAR ALIGNMENT STRUCTURES FORMED ON WAFER

TECHNICAL FIELD

This disclosure relates generally to semiconductor fabrication techniques and, in particular, to photomask alignment techniques for lithographic patterning.

BACKGROUND

Semiconductor integrated circuit devices are fabricated using various processes including, for example, lithography which involves transferring a pattern of a lithographic photomask (or reticle) into a photoresist layer which covers a wafer. In general, a lithography process comprises a sequence of steps including, for example, spin coating a photoresist layer on wafer surface, patterning the photoresist layer to form a photoresist mask, and performing an etch process to transfer an image of the photoresist mask into an underlying layer. The process of patterning the photoresist layer comprises exposing the photoresist layer to radiation (e.g., ultraviolet radiation, electron beam, x-ray, ion beams, etc.) through a lithographic photomask, and then applying an aqueous developer solution to the exposed photoresist layer to pattern the photoresist layer. For a positive photoresist layer, the portions of the photoresist layer that were exposed to radiation through the lithographic photomask are soluble in the developer solution and are etched away, whereas for a negative photoresist layer, the portions of the photoresist layer that were exposed to radiation through the lithographic photomask become insoluble in the developer solution while the non-exposed portions are soluble in the developer solution and are etched away.

Various techniques can be utilized to expose a photoresist layer through a lithographic photomask. For example, projection lithography is a common technique that is used to project an image of a lithographic photomask onto a photoresist layer (e.g., 1:1 projection or reduction projection). A lithographic photomask may comprise a transparent reticle substrate and an image defined by a patterned layer of optically opaque material formed on a surface of the reticle substrate. The lithographic photomask is mounted into a lithographic exposure tool, which may be integrated with a stepper tool, and radiation from a source of the lithographic exposure tool passes through the lithographic photomask and impinges on the photoresist layer, which results in transferring the pattern of the lithographic photomask into the photoresist layer after exposure and development. With the stepper tool, the lithographic printing process is performed step by step, wherein the lithographic photomask is aligned to a target area of the wafer (which may include a plurality of dies), followed by exposure of the target area, and then moved and aligned to another target section for exposure, etc.

In the manufacture of a semiconductor wafer, the integrated circuit features are formed layer-by-layer, wherein the features of one layer must be properly aligned to features in another layer. For example, when fabricating a back-end-of-line (BEOL) interconnect structure, metal lines that are formed in a given metallization level must be properly aligned to interlevel via contacts that are formed in a previous (underlying layer) to order to make proper connections between the metal lines and via contacts. Therefore, before lithographic exposure is performed to transfer an image of a lithographic photomask to a photoresist layer, the image of the lithographic photomask must be properly aligned to a previously defined pattern of a given layer of the wafer.

The alignment of a lithographic photomask is typically performed using alignment marks that are formed on the lithographic photomask and alignment features or marks that are formed in a layer of the wafer. In particular, a lithographic photomask to pattern a given layer of the wafer comprises an alignment pattern which has a predetermined relationship to alignment marks/features formed on a previous layer of the wafer. During an alignment process, the lithographic exposure tool is configured to visually locate the alignment marks/features formed on a given layer of the wafer, and adjust the position of the lithographic photomask to properly register the alignment pattern of the photomask to the alignment marks/features formed on the wafer.

This alignment process is problematic in instance where the layer(s) to be patterned on the wafer are "optically opaque" at the wavelength of the radiation source that is utilized by the lithographic exposure tool for visual alignment of photomasks, as a result of the type of materials and/or the thickness of the layer(s) to be patterned. In such circumstances, the lithographic exposure tool may be unable to properly view the alignment structures on the wafer which are covered by the optically opaque layer(s), thereby resulting in alignment error.

SUMMARY

Embodiments of the invention include techniques for fabricating and utilizing optically opaque non-planar alignment structures in non-die areas of a wafer to align lithographic photomasks to die areas on the wafer. For example, in one embodiment, a method comprises: forming an insulating layer over a surface of a wafer comprising a non-die area and a die area; forming features in the insulating layer, wherein the features comprise a device feature formed in the insulating layer in the die area and a non-planar alignment feature formed in the insulating layer in the non-die area; forming an optically opaque layer stack in the die and non-die areas of the wafer, wherein the optically opaque layer stack comprises at least one conformal layer of optically opaque material which is deposited in the die and non-die areas of the wafer, and which conformally covers the non-planar alignment feature to thereby form an optically opaque non-planar alignment structure in the non-die area of the wafer; and performing a lithographic patterning process to pattern the optically opaque layer stack in the die area, wherein performing the lithographic patterning process comprises utilizing the optically opaque non-planar alignment structure in the non-die area to align a lithographic photomask to the die area.

Another embodiment includes a method which comprises: forming an insulating layer over a surface of a wafer comprising a non-die area and a die area; forming features in the insulating layer, wherein the features comprise a metallic electrode formed in the insulating layer in the die area and a non-planar alignment feature formed in the insulating layer in the non-die area; forming an optically opaque layer stack in the die and non-die areas of the wafer, wherein the optically opaque layer stack comprises a plurality of conformal layers of metallic and insulating materials which are deposited in the die and non-die areas of the wafer, and which conformally cover the non-planar alignment feature to thereby form an optically opaque non-planar alignment structure in the non-die area of the wafer; and performing a lithographic patterning process to pattern the optically opaque layer stack in the die area to thereby form a magnetic tunnel junction structure which is aligned to the metallic electrode in the insulating layer in the die area; wherein performing the lithographic patterning process comprises utilizing the optically opaque non-planar alignment structure in the non-die area to align a lithographic photomask to the die area.

Another embodiment includes a device which comprises: an insulating layer disposed over a surface of a wafer comprising a non-die area and a die area, wherein the insulating layer comprises a non-planar alignment feature in the non-die area of the wafer; and an optically opaque layer stack disposed over the insulating layer in the die and non-die areas of the wafer, wherein the optically opaque layer stack comprises at least one conformal layer of optically opaque material which conformally covers the die and non-die areas of the wafer, and which conformally covers the non-planar alignment feature to form an optically opaque non-planar alignment structure in the non-die area of the wafer; and wherein the optically opaque non-planar alignment structure comprises an alignment structure to align a lithographic photomask to the die area of the wafer to lithographically pattern the optically opaque layer stack in the die area of the wafer.

In other embodiments, an optically opaque non-planar alignment structure comprises an optically opaque mesa alignment structure, an optically opaque trench alignment structure, or any optically opaque alignment structure which comprises at least one stepped sidewall surface.

Other embodiments will be described in the following detailed description of embodiments, which is to be read in conjunction with the accompanying figures.

BRIEF DESCRIPTION OF THE DRAWINGS

FIG. 1 schematically illustrates a wafer comprising a plurality of die areas and kerf areas in which optically opaque non-planar alignment structures are formed and utilized to align lithographic photomasks to the die areas on the wafer, according to an exemplary embodiment of the invention.

FIGS. 2A through 12 schematically illustrate methods for fabricating optically opaque non-planar alignment structures in non-die areas (e.g., kerf areas) of a wafer which are utilized to align lithographic photomasks to die areas on the wafer, according to exemplary embodiments of the invention, wherein:

FIG. 2A is a schematic cross-sectional side view of a wafer at an intermediate stage of fabrication comprising a substrate and a BEOL structure formed on the substrate, wherein the BEOL structure comprises an interlayer dielectric (ILD) layer and a metallization layer comprising liner layers and metallic structures formed in die and kerf areas of the wafer;

FIG. 2A after forming self-aligned metallic capping layers on non-recessed surfaces of the metallic structures, according to an alternate embodiment of the invention;

FIG. 3 is a schematic cross-sectional side view of the structure shown in FIG. 2A after forming a sacrificial dielectric layer over a planarized surface of the ILD layer;

FIG. 4 is a schematic cross-sectional side view of the structure shown in FIG. 3 after patterning the sacrificial dielectric layer to form a block mask which covers the ILD layer in the die area and which exposes the ILD layer and a metallic alignment structure in the kerf area which forms part of mesa alignment structure;

FIG. 6 is a schematic cross-sectional side view of the structure shown in FIG. 5A after removing a remaining portion of the sacrificial dielectric layer that covers the die area;

FIG. 7 is a schematic cross-sectional side view of the structure shown in FIG. 6 after forming an optically opaque layer stack in the kerf and die areas of the wafer, which results in the formation of an optically opaque mesa alignment structure in the kerf area of the wafer;

FIG. 8 is a schematic cross-sectional side view of the structure shown in FIG. 7 after forming a lithographic material stack comprising a planarizing layer and a photoresist layer in the kerf and die areas of the wafer;

FIG. 9 is a schematic cross-sectional side view of the structure shown in FIG. 8 after aligning a lithographic photomask to the die area of the wafer using the optically opaque mesa alignment structure in the kerf area of the wafer;

FIG. 10 is a schematic cross-sectional side view of the structure shown in FIG. 9 after patterning the photoresist layer to form a photoresist etch mask and using the photoresist etch mask to pattern the planarizing layer;

FIG. 11 is a schematic cross-sectional side view of the structure shown in FIG. 10 after patterning the optically opaque layer stack to form device structures in the die area which are aligned to the metallic structures in the ILD layer of the die area; and FIG. 12 is a schematic cross-sectional side view of the structure shown in FIG. 11 after forming another level of the BEOL structure comprising a second ILD layer, and a metallization layer comprising liner layers and metallic structures formed in the die and kerf areas of the wafer.

FIGS. 13 and 14 schematically illustrate a method for fabricating optically opaque non-planar alignment structures in non-die areas (e.g., kerf areas) of a wafer which are utilized to align lithographic photomasks to die areas on the wafer, according to another embodiment of the invention, wherein:

FIG. 13 is a schematic cross-sectional side view of the structure shown in FIG. 4 after etching the metallic structure in the kerf area to form a trench in the ILD layer in the kerf area; and FIG. 14 is a schematic cross-sectional side view of the structure shown in FIG. 13 after removing a remaining portion of the sacrificial dielectric layer and forming an optically opaque layer stack in the kerf and die areas of the wafer, which results in the formation of an optically opaque trench alignment structure in the kerf area of the wafer.

DETAILED DESCRIPTION

Figure 2B:
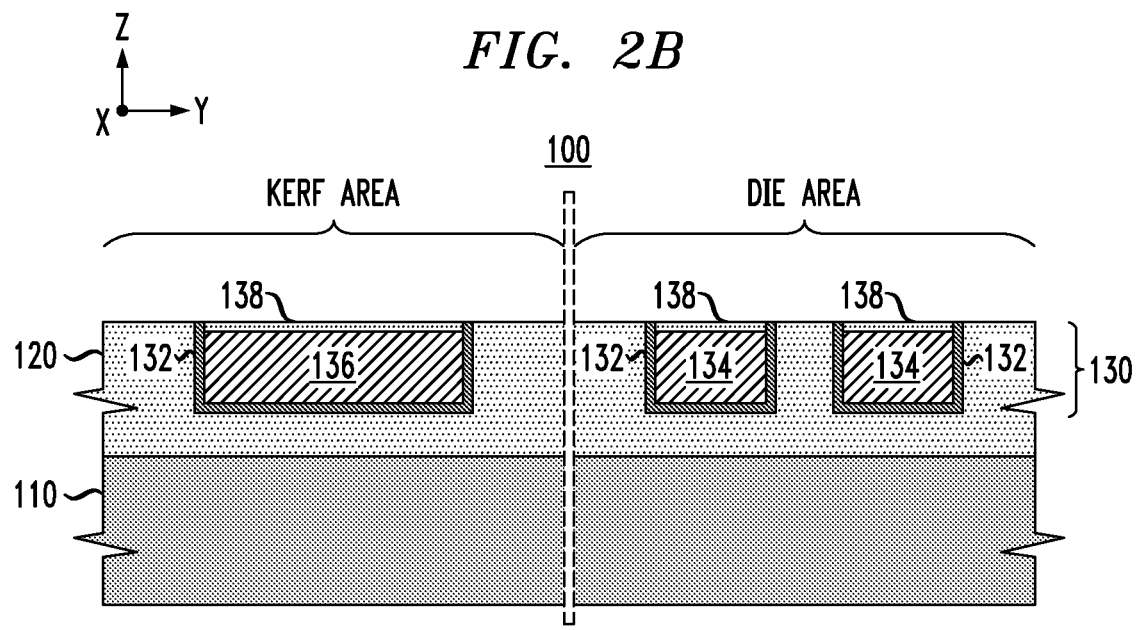
FIG. 2B is a schematic cross-sectional side view of the structure shown in FIG. 2A after forming self-aligned metallic capping layers on recessed surfaces of the metallic structures, according to an alternate embodiment of the invention.

Embodiments of the invention will now be described in further detail with regard to methods for fabricating and utilizing optically opaque non-planar alignment structures in non-die areas (e.g., kerf areas) of a wafer to align lithographic photomasks to die areas of the wafer. As explained in further detail below, the optically opaque non-planar alignment structures provide an optically opaque structural topology (e.g., step-like topography) which serves as an alignment mark for aligning a photomask to die areas on a wafer when the die areas are covered by optically opaque layer(s) which are to be patterned using the photomask.

It is to be understood that the various layers, structures, and regions shown in the accompanying drawings are schematic illustrations that are not drawn to scale. In addition, for ease of explanation, one or more layers, structures, and regions of a type commonly used to form semiconductor IC devices or structures may not be explicitly shown in a given drawing. This does not imply that any layers, structures, and regions not explicitly shown are omitted from the actual semiconductor IC device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor IC devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

The term "exemplary" as used herein means "serving as an example, instance, or illustration". Any embodiment or design described herein as "exemplary" is not to be construed as preferred or advantageous over other embodiments or designs. The word "over" as used herein to describe forming a feature (e.g., a layer) "over" a side or surface, means that the feature (e.g. the layer) may be formed "directly on" (i.e., in direct contact with) the implied side or surface, or that the feature (e.g. the layer) may be formed "indirectly on" the implied side or surface with one or more additional layers disposed between the feature (e.g., the layer) and the implied side or surface.

As used herein, a material is "optically opaque" if the extinction coefficient (k) of the material is not less than 1.0 at the wavelength of the radiation source which is utilized by a lithographic exposure tool for visual alignment of lithographic photomasks. As used herein, a material is "optically transparent" if the extinction coefficient (k) of the material is less than 1.0 at the wavelength of the radiation source which is utilized by the lithographic exposure tool for visual alignment of lithographic photomasks. As is known in the art, the extinction coefficient (k) (or attenuation coefficient) for a given material comprises a measure of the absorption of light (e.g., visible light) by the given material at a given wavelength of radiation.

The term "non-die area" as used herein is broadly construed to be any area of a wafer that is not part of a die footprint of dies on the wafer. For example, a non-die area of a wafer can be a kerf area of the wafer. In addition, the term "mesa structure" as used herein is broadly construed to be any type of raised plateau-like structure with vertical or tapering sidewalls. The term "optically opaque mesa alignment structure" as used herein is broadly construed to be any type of alignment mark which comprises a "mesa structure" and which is "optically opaque" at the wavelength of a radiation source which is utilized by a lithographic exposure tool for visual alignment of lithographic photomasks. The term "optically opaque non-planar alignment structure" as used herein is broadly construed to be any type of alignment structure comprising an optically opaque step-like topography (e.g. at least one vertical or tapered sidewall, etc.).

To provide spatial context to the different structural orientations of the semiconductor IC device structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

FIG. 1 schematically illustrates a wafer 10 comprising a plurality of die areas 12 and kerf areas 14 in which optically opaque non-planar alignment structures are formed and utilized to align lithographic photomasks to the die areas 12 on the wafer 10. As is known in the art, the kerf areas 14 (also referred to as dicing streets or scribe lines) are the areas of the wafer 10 which surround the dies 12 and which are cut or scribed during a wafer dicing process to separate the wafer 10 into the individual dies 12. The kerf areas 14 define a minimum distance between dies 12 which is required by the given dicing technology and other factors. For example, the kerf areas 14 can have a width of about 60 microns, although the width of the kerf areas 14 varies for different technologies. The wafer dicing process is performed using various methods such as scribing and breaking, mechanical sawing with a dicing saw, or laser cutting, all of which are automated for precision dicing. Following the dicing process, the individual dies 12 are packaged into chip carriers and packaged to construct electronic devices.

FIGS. 2A through 12 schematically illustrate methods for fabricating optically opaque non-planar alignment structures in non-die areas (e.g., kerf areas) of a wafer which are utilized to align lithographic photomasks to die areas on the wafer, according to embodiments of the invention. For purposes of illustration, FIGS. 2A through 12 schematically illustrate methods for constructing optically opaque mesa alignment structures in kerf areas of a wafer during a back-end-of line (BEOL) fabrication stage, although it is to be understood that the lithographic alignment techniques described herein can be implemented during front-end-of line (FEOL) and middle-of-the-line (MOL) processing stages. Furthermore, for illustrative purposes, exemplary embodiments of the invention will be discussed in the context of fabricating magnetic random-access memory (MRAM) elements in a BEOL structure.

As is known in the art, MRAM is a type of solid state, non-volatile memory that uses tunneling magnetoresistance (TMR) to store information. A MRAM array comprises an electrically connected array of magnetoresistive memory elements, referred to as magnetic tunnel junctions (MTJs). A basic structure of a magnetic tunnel junction includes at least two thin ferromagnetic layers separated by a thin insulating layer through which electrons can tunnel. A spin-transfer torque (STT) phenomenon is realized in an MTJ structure, wherein one ferromagnetic layer (referred to as "magnetic free layer") has a non-fixed magnetization, and the other ferromagnetic layer (referred to as a "magnetic pinned layer", or "reference layer") has a "fixed" magnetization. A magnetic tunnel structure can be fabricated with multiple magnetic, conductive and/or insulting layers, depending on the given application. For example, additional stacked layers may include two or more magnetic layers and two or more tunnel barrier layers, and other layers that are commonly implemented to construct other types of magnetic tunnel junction structures, e.g., double magnetic tunnel junction structures.

When fabricating MRAM devices in a BEOL layer, a stack of metallic and insulating layers which are deposited and patterned to form the MTJ structures, comprise an optically opaque stack of layers which cover the entire wafer area. In this instance, as explained in further detail below, mesa alignment structures are formed in kerf areas of the wafer and utilized as alignment marks to align a lithographic photomask to the die areas on the wafer which are covered by the optically opaque stack of layers, and thereby lithographically pattern the optically opaque stack of layers to form individual MTJ structures which are aligned to underlying electrodes.

FIG. 2A is a schematic cross-sectional side view of a wafer 100 at an intermediate stage of fabrication comprising a substrate 110 and a BEOL structure formed on the substrate 110. The BEOL structure comprises an interlayer dielectric (ILD) layer 120 and a metallization layer 130 comprising liner layers 132 and metallic structures 134 and 136 formed in die and kerf areas of the wafer 100. In the die area, in some embodiments, the metallic structures 134 comprise metallic wiring and/or via structures that form a BEOL interconnect structure. In other embodiments, the metallic structures 134 comprise bottom electrodes of MRAM devices that are to be formed within the BEOL structure. In the kerf area, the metallic structure 136 comprises a metallic alignment structure which is part of an optically opaque mesa alignment structure that is formed in the kerf area to enable alignment of one or more lithographic photomasks that are used for patterning a stack of one or more optically opaque layers in the die area. It is to be noted that in each drawing of FIGS. 2A-12, the X-Y plane represents a plane that is parallel to the plane of the wafer 100 being processed. The intermediate structure shown in FIG. 2A can be fabricated using known materials and techniques.

For example, while the substrate 110 is generically depicted for ease of illustration, it is to be understood that the substrate 110 comprises multiple layers including a semiconductor wafer substrate layer, a FEOL layer formed on the semiconductor wafer substrate, and a MOL layer formed on the FEOL layer. The semiconductor wafer substrate comprises one of different types of semiconductor wafer substrate structures and materials. For example, in one embodiment, the semiconductor wafer substrate can be a bulk semiconductor wafer substrate that is formed of silicon (Si) or germanium (Ge), or other types of semiconductor substrate materials which are commonly used in bulk semiconductor fabrication processes such as a silicon-germanium alloy, compound semiconductor materials (e.g. III-V), etc. In another embodiment, the semiconductor wafer substrate may comprise an SOI (silicon-on-insulator) substrate, GeOI (germanium-on-insulator) substrate, or other types of semiconductor-on-insulator substrates which comprise an insulating layer (e.g., oxide layer) disposed between a base substrate layer (e.g., silicon substrate) and the active semiconductor layer (e.g., Si, Ge, etc.) in which active circuit components are formed as part of the FEOL.

The FEOL layer comprises various semiconductor devices and components that are formed in or on an active surface of the semiconductor wafer substrate to provide integrated circuitry for a target application. For example, the FEOL layer comprises field-effect transistor (FET) devices (such as FinFET devices, vertical FET devices, planar FET devices, etc.), bipolar transistors, diodes, capacitors, inductors, resistors, isolation devices, etc., which are formed in or on the active surface of the semiconductor wafer substrate. In general, FEOL processes typically include preparing the semiconductor wafer substrate, forming isolation structures (e.g., shallow trench isolation), forming device wells, patterning gate structures, forming spacers, forming source/drain regions (e.g., via implantation), forming silicide contacts on the source/drain regions, forming stress liners, etc. The MOL layer comprises a PMD (pre-metal dielectric layer) and conductive contacts (e.g., source/drain contacts, gate contacts, etc.) that are formed in the PMD layer. The PMD layer is formed on the components and devices of the FEOL layer. The conductive contacts of the MOL layer provide electrical connections between the integrated circuitry of the FEOL layer and a first level of metallization of a BEOL structure that is formed over the FEOL/MOL layers.

In the example embodiment of FIG. 2A, it is assumed for illustrative purposes that the ILD layer 120 is formed as part of a first interconnect layer of a BEOL interconnect structure. The ILD layer 120 may comprise any suitable dielectric material that is commonly utilized in BEOL process technologies. For example, the ILD layer 120 can be formed of a dielectric material including, but not limited to, silicon oxide (e.g. $SiO_2$), silicon nitride (e.g., $Si_3N_4$), a hybrid silica-based low-k dielectric material such as carbon-doped silicon glass (e.g., carbon-doped silicon glass (SiCOH) or organosilicate glass (SOG)), SiCH, SiCNH, etc.), a fluorinated silicon glass (FSG), a low-k porous dielectric material (k less than about 3.9), or an ULK (ultra-low-k) dielectric material (with k less than about 2.5 etc.), wherein "k" denotes a relative dielectric constant. The ILD layer 120 may be deposited using known deposition techniques, such as, for example, ALD (atomic layer deposition), CVD (chemical vapor deposition) PECVD (plasma-enhanced CVD), or PVD (physical vapor deposition), or spin-on deposition, or other deposition techniques that are suitable to form low-k dielectric layers.

The metallization layer 130 is formed using known methods. For example, the ILD layers 130 is patterned to form openings (e.g., trenches, vias, etc.) in the die and kerf areas of the wafer using suitable lithographic and etching methods. A conformal layer of liner material which forms the liner layers 132 is then deposited over the patterned surface of the ILD layer 120 line the sidewall and bottom surfaces of the etched openings in the ILD layer 120. The liner material serves as a diffusion barrier layer which can include materials that are commonly used as diffusion barrier layers for copper interconnects including, but not limited to, titanium (Ti), tantalum (Ta), titanium nitride (TiN), tantalum nitride (TaN), cobalt (Co), etc. In addition, the liner layers 132 may comprise a thin seed layer to serve as a wetting or adhesion layer for the deposition of the metallic material which fills the etched openings to form the metallic structures 134 and 136.

A layer of metallic material is then deposited to fill the etched openings in the ILD layer 120 with metallic material. In one embodiment, the layer of metallic material comprises copper, which is deposited using any suitable copper deposition method. In other embodiments, when the metallic structures 134 comprise bottom electrodes of MRAM devices, the metallic material that forms the metallization layer 130 can include any suitable conductive material(s) such as tantalum, tantalum nitride, ruthenium, titanium, etc. The layer of metallic material can be deposited using any suitable wet or dry deposition method. A chemical-mechanical planarizing (CMP) is then performed to remove overburden portions of the liner layer, seed layer, and metallic layer down to the ILD layer, resulting in the intermediate structure shown in FIG. 2A.

In other embodiments, self-aligned metallic capping layers are formed on the upper surfaces of the metallic structures 134 and 136 using known methods. For example, in one embodiment, FIG. 2B is a schematic cross-sectional side view of the structure shown in FIG. 2A after forming self-aligned metallic capping layers 138 on recessed surfaces of the metallic structures 134 and 136. The metallic capping layers 138 are formed by a process which comprises recessing the upper surfaces of the metallic structures 134 and 136 down to a target level below the upper surface of the ILD layer 120, and then selectively depositing a layer of metallic material such that the metallic material is deposited on the exposed recessed surfaces of the metallic structures 134 and 136, and not on the upper surface of the ILD layer 120. The metallic capping layers 138 can be formed with any suitable metallic material including, but not limited to, ruthenium (Ru), cobalt (Co), rhodium (Rh), tungsten (W), titanium nitride (TiN), tantalum nitride (TaN), or other suitable metallic materials which are chemically inert and non-reactive with the dielectric materials that form the ILD layers of the BEOL interconnect. The metallic capping layers 138 can be selective deposited on the exposed recessed surfaces of the metallic structures 134 and 136 using known deposition techniques such as ALD, CVD, etc., wherein the deposition parameters are tuned to achieve selective deposition of the metallic material on the recessed surfaces of the metallic structures 134 and 136.

Figure 2C:
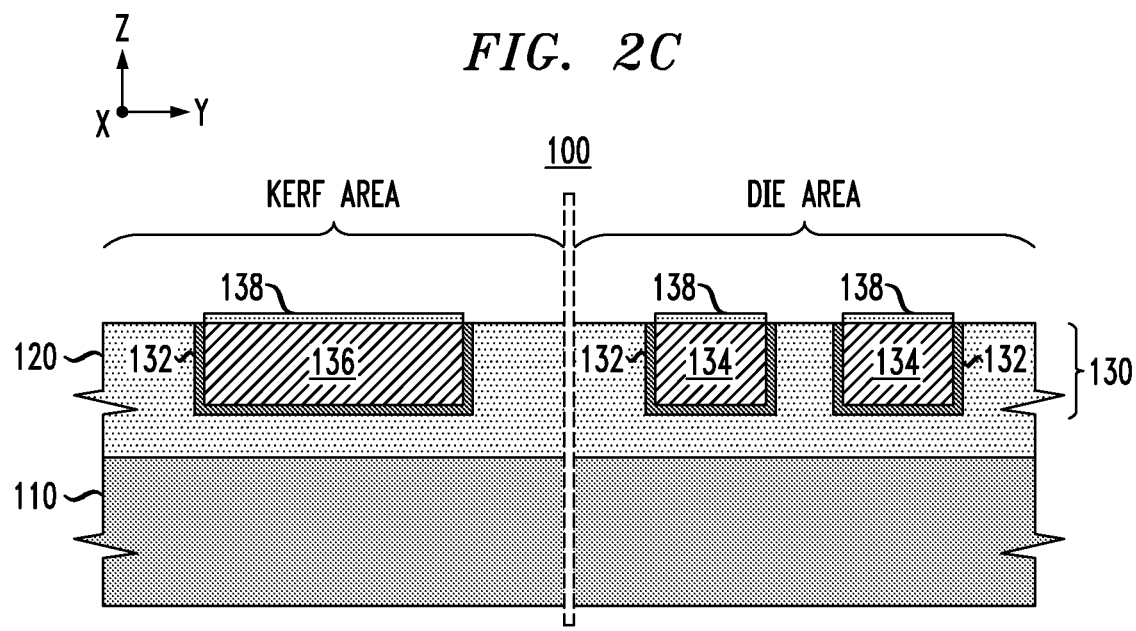
FIG. 2C is a schematic cross-sectional side view of the structure shown in FIG.

In another embodiment, FIG. 2C is a schematic cross-sectional side view of the structure shown in FIG. FIG. 2A after forming self-aligned metallic capping layers 138 on the exposed (non-recessed) surfaces of the metallic structures 134 and 136. The metallic capping layers 138 are formed by a process which comprises selectively depositing a layer of metallic material such that the metallic material is deposited on the exposed surfaces of the metallic structures 134 and 136, and not on the upper surface of the ILD layer 120. The metallic capping layers 138 can be formed using metallic materials and selective deposition methods as discussed above.

Figure 3:
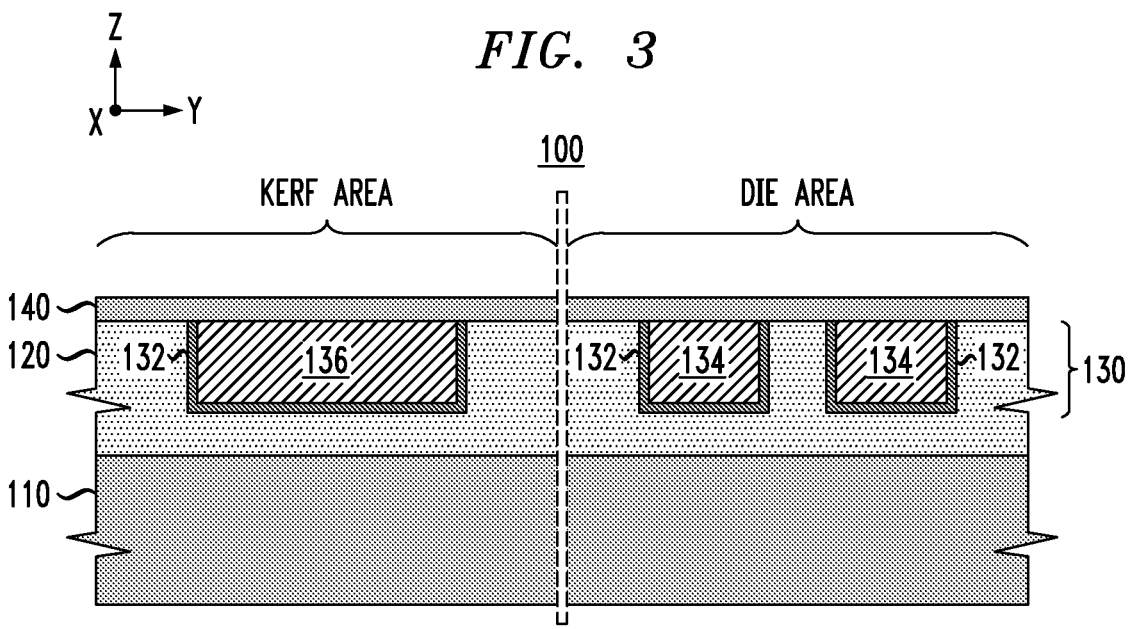

Next, FIG. 3 is a schematic cross-sectional side view of the structure shown in FIG. 2A after forming a sacrificial dielectric layer 140 over the planarized surface of the structure ILD layer 120. The sacrificial dielectric layer 140 is formed of a dielectric material which is optically transparent at the wavelength of the radiation source which is utilized by the lithographic exposure tool for visual alignment of photomasks. In some embodiments, the sacrificial dielectric layer 140 is formed of silicon nitride (e.g., SiN, SiN:H, etc.) or other dielectric materials which are suitable for the given application. The sacrificial dielectric layer 140 is formed with a thickness in a range of about 5 nm to about 100 nm. It is to be understood that in other embodiments, the sacrificial dielectric layer 140 is deposited on the intermediate structures shown in FIGS. 2B and 2C, which is then followed by the same processing steps as schematically illustrated in FIGS. 4-11. For ease of illustration and brevity of explanation, the process flow of FIGS. 4-11 will be discussed in detail in the context the intermediate structure shown in FIG. 3.

Figure 4:
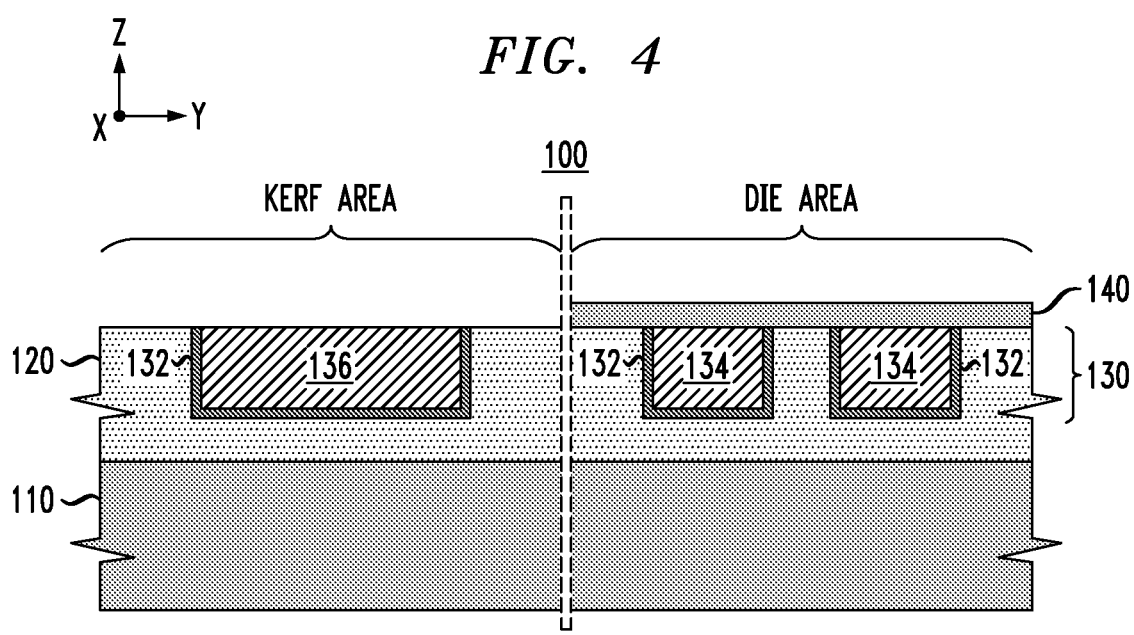

FIG. 4 is a schematic cross-sectional side view of the structure shown in FIG. 3 after patterning the sacrificial dielectric layer 140 to form a block mask which covers the ILD layer 120 in the die area and which exposes the ILD layer 120 and the metallic alignment structure 136 in the kerf area. The sacrificial dielectric layer 140 can be patterned using a lithographic patterning method which comprises (i) forming an etch mask (e.g., photoresist mask) which covers the portion of the sacrificial dielectric layer 140 in the die area, while exposing the portion of the sacrificial dielectric layer 140 in the kerf area, and (ii) etching the exposed portion of the sacrificial dielectric layer 140 using a dry etch process (e.g., reactive ion etch (RIE)) which etches the sacrificial dielectric layer 140 selective to the materials that form the ILD layer 120 and the metallic structure 136.

Figure 5A:
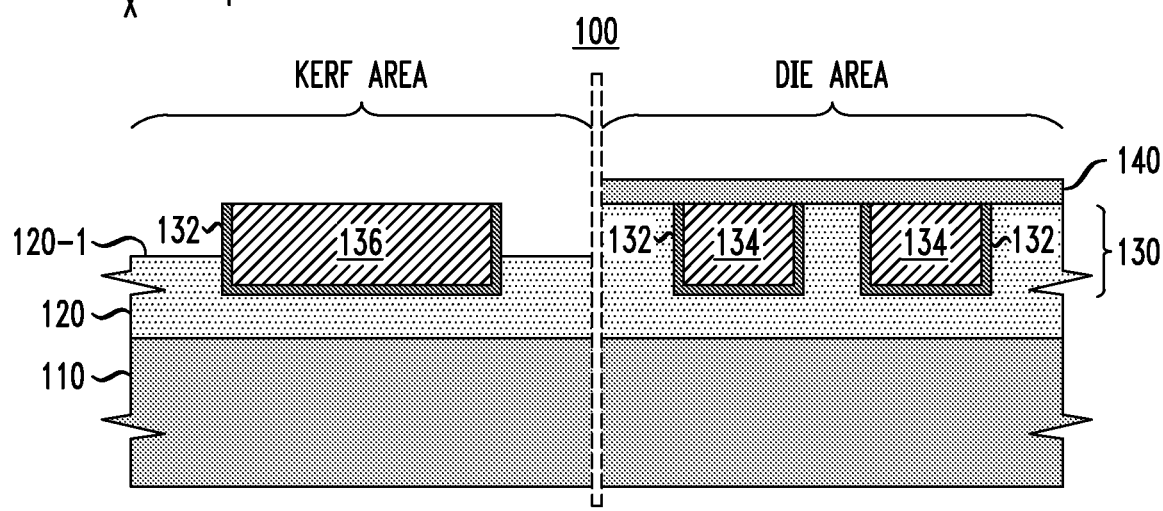
FIG. 5A is a schematic cross-sectional side view of the structure shown in FIG. 4 after recessing the exposed portion of the ILD layer in the kerf area down to a target level below an upper surface of the metallic alignment structure to expose an upper portion of the metallic alignment structure.

Next, FIG. 5A is a schematic cross-sectional side view of the structure shown in FIG. 4 after recessing the exposed portion of the ILD layer 120 in the kerf area down to a target level below an upper surface of the metallic alignment structure 136 to expose an upper portion of the metallic alignment structure 136. In some embodiments, the exposed portion of the ILD layer 120 in the kerf area is recessed using an anisotropic dry etch process (e.g., RIE) with an etch chemistry that is configured to etch the ILD layer 120 selective to the materials which form the liner layer 132, the metallic alignment structure 136, and the sacrificial dielectric layer 140. With this ILD recess process, the sacrificial dielectric layer 140 protects the ILD layer 120 in the die area from being etched.

Figure 5B:
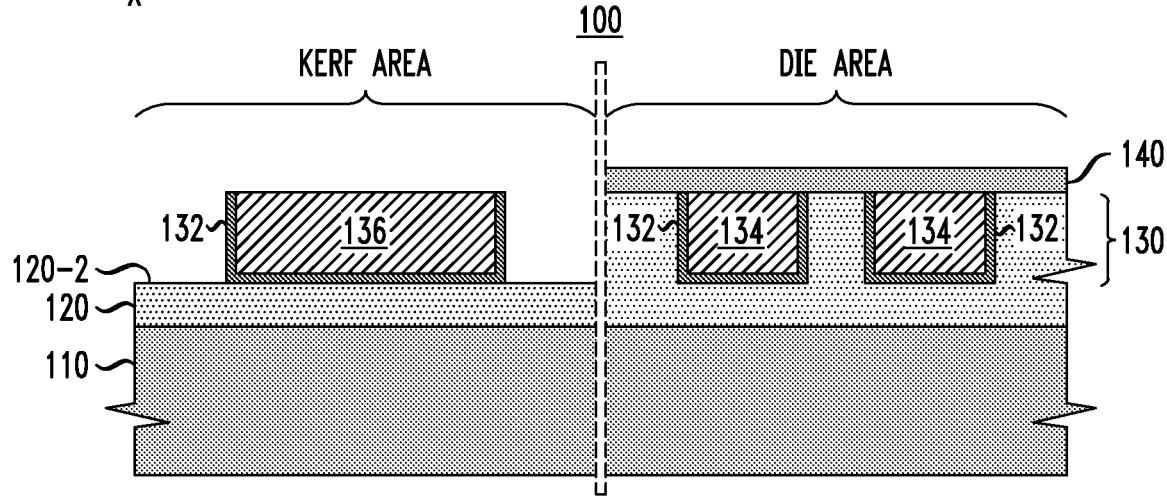
FIG. 5B is a schematic cross-sectional side view of the structure shown in FIG. 4 after recessing the exposed portion of the ILD layer in the kerf area down to a target level which is substantially coplanar with a bottom surface of the metallic alignment structure, according to an alternate embodiment of the invention.
Figure 5C:
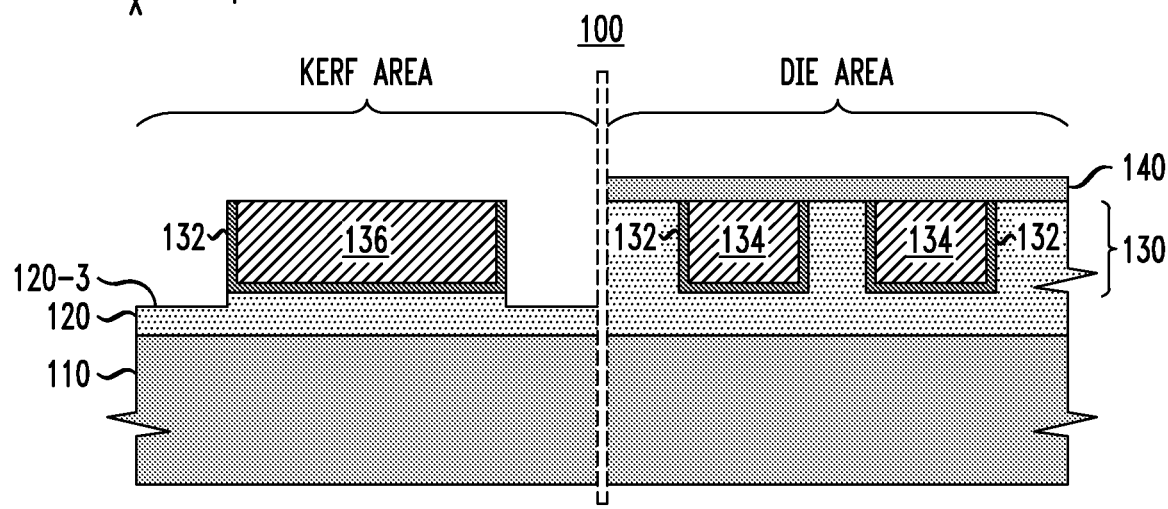
FIG. 5C is a schematic cross-sectional side view of the structure shown in FIG. 4 after recessing the exposed portion of the ILD layer in the kerf area down to a target level which is below a bottom surface of the metallic alignment structure, according to an alternate embodiment of the invention.

In some embodiments, as schematically illustrated in FIG. 5A, the ILD layer 120 in the kerf area is recessed to a target level 120-1 between upper and lower surfaces of the metallic alignment structure 136. In another embodiment, such as schematically illustrated in FIG. 5B, the ILD layer 120 in the kerf area is recessed to a target level 120-2 which is substantially coplanar with a bottom surface of the metallic alignment structure 136. In another embodiment, such as schematically illustrated in FIG. 5C, the ILD layer 120 in the kerf area is recessed to a target level 120-3 below the bottom surface of the metallic alignment structure 136. In each of the alternative embodiments shown in FIGS. 5A, 5B, and 5C, the recess etching of the ILD layer 120 in the kerf area serves to create a non-planar surface topography (e.g., a mesa topography) in the kerf area to enable the formation of mesa alignment structures in the kerf areas. For ease of illustration and brevity of explanation, the process flow of FIGS. 6-11 will be discussed in detail in the context of the intermediate structure shown in FIG. 5A, although it is to be understood that the same or similar processing stages schematically illustrated in FIGS. 6-11 can be performed following the formation of the intermediate structures shown in FIGS. 5B and 5C.

Figure 6:
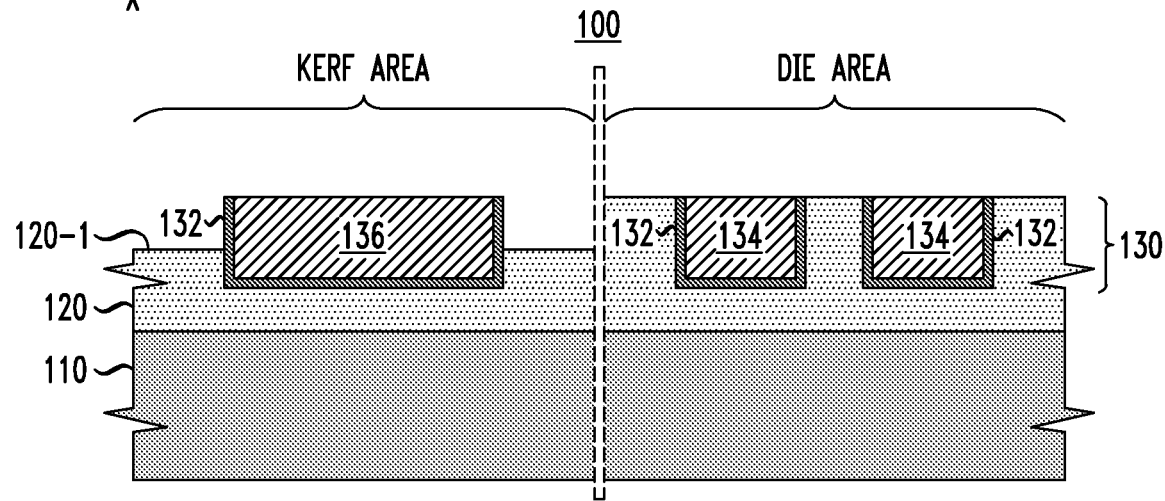

Next, FIG. 6 is a schematic cross-sectional side view of the structure shown in FIG. 5A after removing a remaining portion of the sacrificial dielectric layer 140 that covers the die areas. The sacrificial dielectric layer 140 can be removed using a wet or dry etch process with an etch chemistry configured to etch the sacrificial dielectric layer 140 selective to the materials which form the ILD layer 120, the liner layer 132, and the metallic structures 134 and 136. Following removal of the sacrificial dielectric layer 140 a stack of one more layers of optically opaque material is formed in the kerf and die areas, which results in the formation of optically opaque mesa alignment structures in the kerf areas of the wafer.

Figure 7:
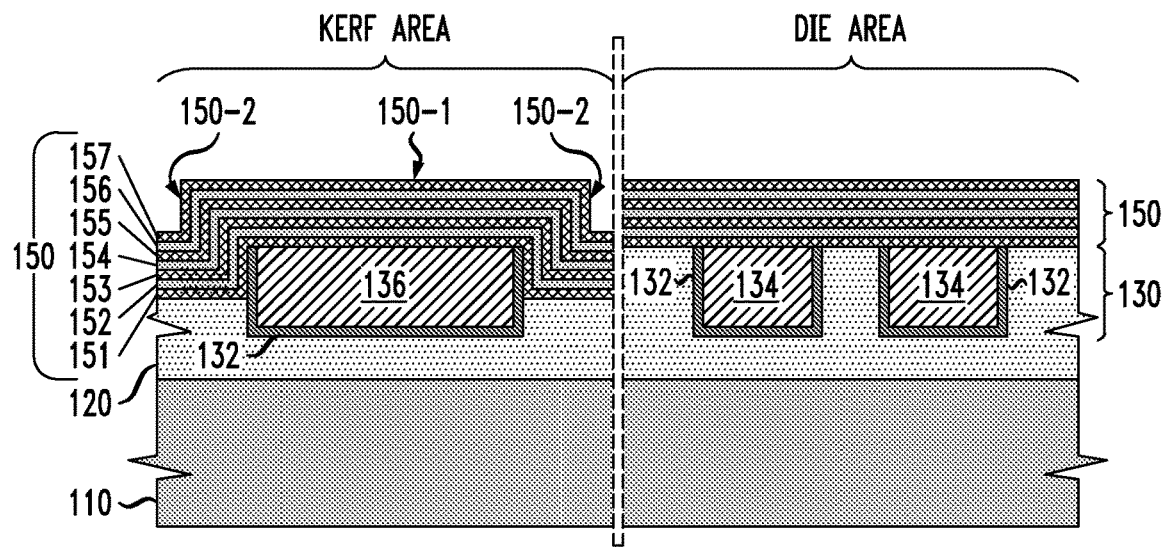

In particular, FIG. 7 is a schematic cross-sectional side view of the structure shown in FIG. 6 after forming a stack of optically opaque layers 150 (or optically opaque layer stack 150) in the kerf and die areas of the wafer 100, which results in the formation of an optically opaque mesa alignment structure in the kerf area of the wafer 100. In the exemplary embodiment of FIG. 7, the stack of optically opaque layers 150 comprises a plurality of thin conformal layers 151, 152, 153, 154, 155, 156, and 157 which are sequentially deposited over the surface of the wafer 100. In some embodiments, the thin conformal layers 151, 152, 153, 154, 155, 156, and 157 are formed of metallic and insulating materials which are optically opaque at the wavelength of the radiation source which is utilized by the lithographic exposure tool for visual alignment of lithographic photomasks.

For example, the optically opaque layer stack 150 can include one or more metallic layers comprising copper (Cu), aluminum (Al), tungsten (W), ferromagnetic materials, tantalum (Ta), titanium (Ti), ruthenium (Ru), chromium (Cr), or oxide, nitride, or alloys of such metallic materials. In addition, the optically opaque layer stack 150 can include one or more insulating layers comprising amorphous aluminum oxide (AlO), germanium oxide (GeO), magnesium oxide (MgO), strontium titanate ($SrTiO_3$), etc. In embodiments where MRAM devices are formed in the BEOL structure, the optically opaque layer stack 150 comprises metallic and insulating materials which form, e.g., magnetic pinned layer(s), magnetic free layer(s), tunnel barrier layer(s), etc., of MTJ structures which are subsequently formed by patterning the optically opaque layer stack 150 in the die area. For example, a magnetic pinned layer may comprise a layer of magnetic material such as cobalt, iron, boron, or any combination thereof (e.g., CoFeB or CoFe). A tunnel barrier layer may comprise a non-magnetic, insulating material such as magnesium oxide (MgO), aluminum oxide (AlO), or titanium oxide (TiO) or any other suitable materials. A free magnetic layer may comprise a magnetic material such as iron, or a magnetic material including at least one of cobalt or iron or nickel, or any combination thereof.

In other embodiments, the optically opaque layer stack 150 can include a single conformal layer of material (e.g., metallic material) which is optically opaque at the wavelength of the radiation source which is utilized by the lithographic exposure tool for visual alignment of lithographic photomasks. It is to be understood that the number of layers and types of materials that form the optically opaque layer stack 150 will vary depending on the device features/structure that are to be formed in the die area by patterning the optically opaque layer stack 150 in the die area. In all embodiments, as shown in FIG. 7, the optically opaque layer stack 150 completely covers the die area of the wafer 100 with optically opaque material, which prevents underlying features in the die area to be utilized as alignment marks for the alignment of a lithographic photomask which is used to pattern the optically opaque layer stack 150 in the die area to form device features/structures (e.g., MTJ structures).

On the other hand, the optically opaque layer stack 150 in the kerf area conformally covers the exposed upper portion of the metallic alignment structure 136, thereby forming an optically opaque mesa alignment structure in the kerf area of the wafer 100 which serves as an alignment mark. The optically opaque mesa alignment structure comprises an elevated structure with a flat upper surface 150-1 and steep sidewalls 150-2. The optically opaque mesa alignment structure within the kerf area is utilized as an alignment mark for patterning the optically opaque layer stack 150 in the die area using a process flow as schematically illustrated in FIGS. 8-10.

Figure 8:
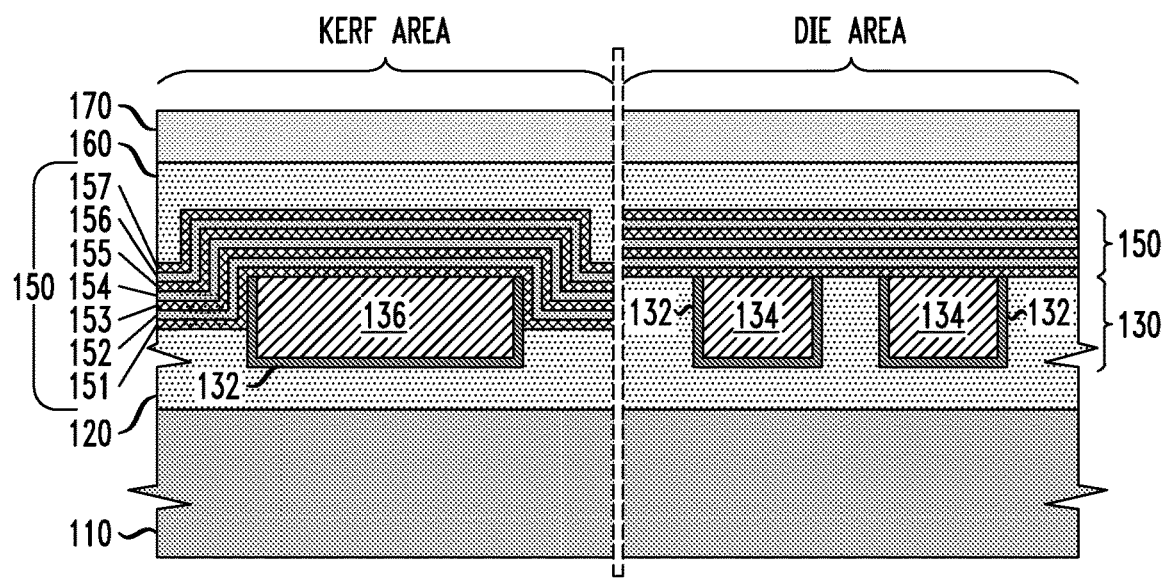

In particular, FIG. 8 is a schematic cross-sectional side view of the structure shown in FIG. 7 after forming a lithographic material stack comprising a planarizing layer 160 and photoresist layer 170 in the kerf and die areas of the wafer 100. The planarizing layer 160 and the photoresist layer 170 are formed of materials that are optically transparent at the wavelength of the radiation source which is utilized by the lithographic exposure tool for visual alignment of lithographic photomasks. The planarizing layer 160 may comprise an organic planarizing layer (OPL) (e.g., organic polymer) or an organic dielectric layer (ODL) or any other type of material which is self-leveling and achieves planarization over the topography in the kerf area without the use of etching, chemical mechanical polishing, or other conventional planarization techniques. In one exemplary embodiment, the planarizing layer 160 comprises an organic planarization material, which is a self-planarizing organic material that includes carbon, hydrogen, oxygen, and optionally nitrogen, fluorine, and silicon. The self-planarizing organic material can be a polymer with sufficiently low viscosity so that the top surface of the applied polymer forms a planar horizontal surface. The planarizing layer 160 is formed by spin-coating, and has a thickness in a range of about 50 nm to about 500 nm.

The photoresist layer 170 is formed over the planarizing layer 160 by, e.g., spin coating. The thickness of the photoresist layer 170 is in a range of about 20 nm to about 800 nm, although lesser and greater thicknesses can also be employed. The photoresist layer 170 can be a layer of a photoresist sensitive to deep-ultraviolet (DUV) radiation, extreme ultraviolet (EUV), or mid-ultraviolet (MUV) radiation as known in the art, or can be an e-beam resist that is sensitive to radiation of energized electrons.

Figure 9:
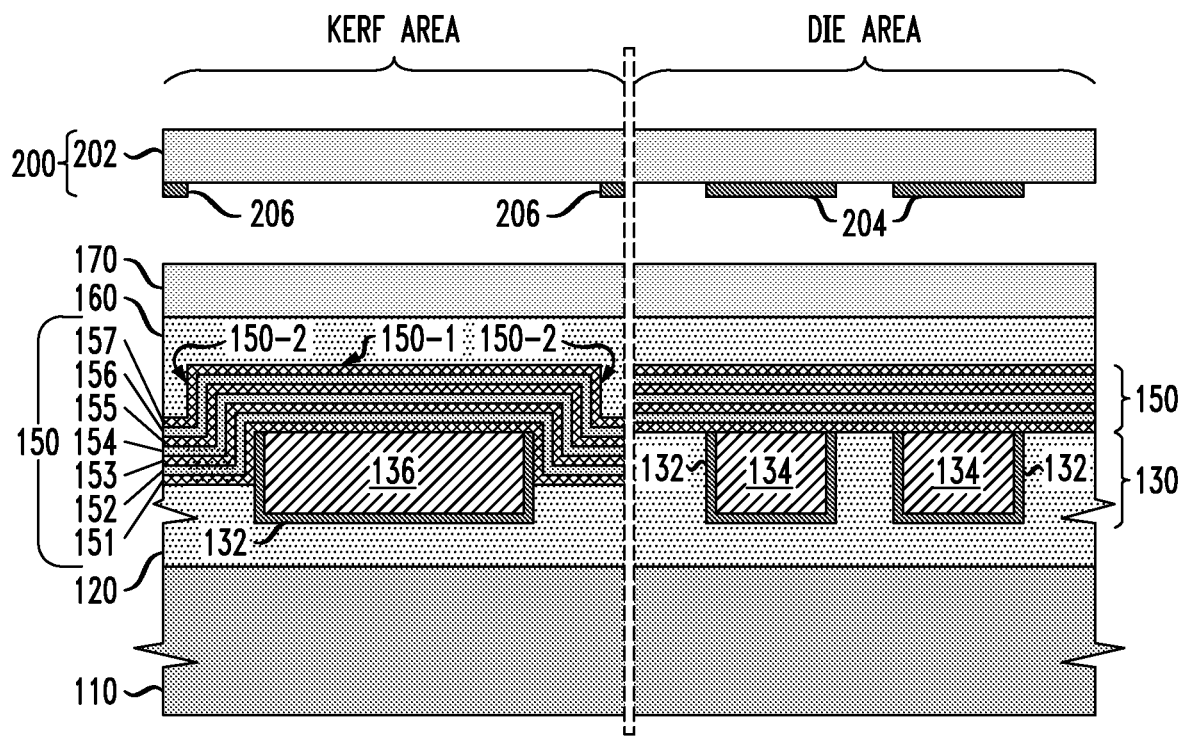
Figure 10:
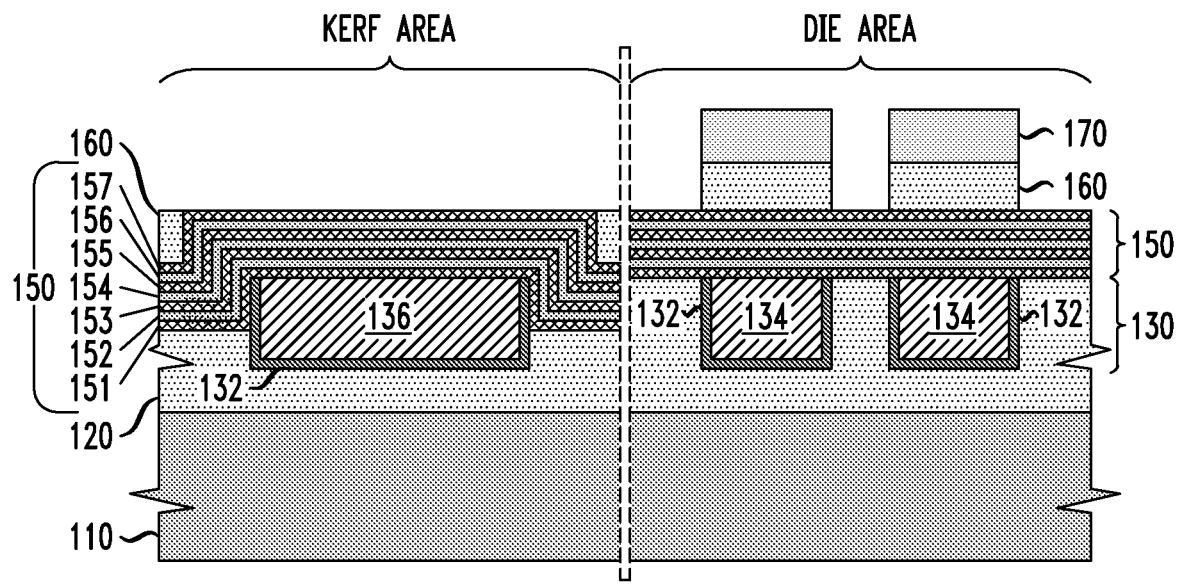

Next, FIG. 9 is a schematic cross-sectional side view of the structure shown in FIG. 8 after aligning a lithographic photomask 200 to the die area of the wafer 100 using the optically opaque mesa alignment structure in the kerf area of the wafer 100. As schematically illustrated in FIG. 9, the lithographic photomask 200 comprises a transparent reticle substrate 202 and an optically opaque coating which is patterned to include a device pattern 204 and an alignment pattern 206. The device pattern 204 defines an image of the features (e.g., MTJ structures) to be patterned in the optically opaque layer stack 150 in the die area, and the alignment pattern 206 is utilized to align the lithographic photomask 200 to the optically opaque mesa alignment structure formed in the kerf area.

In particular, FIG. 9 schematically illustrates an exemplary embodiment in which alignment of the lithographic photomask 200 is achieved by aligning the features of the alignment pattern 206 to the steep sidewalls 150-2 of the optically opaque mesa alignment structure in the kerf area. The optically opaque mesa alignment structure and the alignment pattern 206 can be formed to have any suitable type of shapes and patterns which are sufficient to enable accurate alignment. For example, the mesa alignment structure may be a rectangular-shaped structure, and the alignment pattern 206 can be a rectangular frame that is shaped to surround the mesa alignment structure (e.g., a "box in box" alignment) when alignment is achieved. In other embodiments, the alignment pattern 206 may comprise four L-shaped marks (or right-angle features) that are configured to align to each of the four corners of the rectangular-shaped mesa alignment structure to achieve alignment.

In the exemplary embodiment of FIG. 9, it is assumed that the photoresist layer 170 comprises a positive photoresist such that the device and alignment patterns 204 and 206 of the photomask 200 are optically opaque at the wavelength of the radiation source that is utilized to expose the photoresist layer 170 and such that the portions of the photoresist layer 170 which are exposed to radiation through the photomask 200 become soluble in developer solution. In this regard, FIG. 10 is a schematic cross-sectional side view of the structure shown in FIG. 9 after patterning the photoresist layer 170 to form a photoresist etch mask and using the photoresist etch mask to pattern the planarizing layer 160. More specifically, following exposure, the photoresist layer 170 is developed using known methods to form a photoresist etch mask. The photoresist etch mask is then utilized to etch exposed portions of the planarizing layer 160 down to the upper surface of the optically opaque layer stack 150 in the die and kerf areas of the wafer, resulting the intermediate structure shown in FIG. 10, which comprises an etch mask that is used for patterning the underlying optically opaque layer stack 150.

Figure 11:
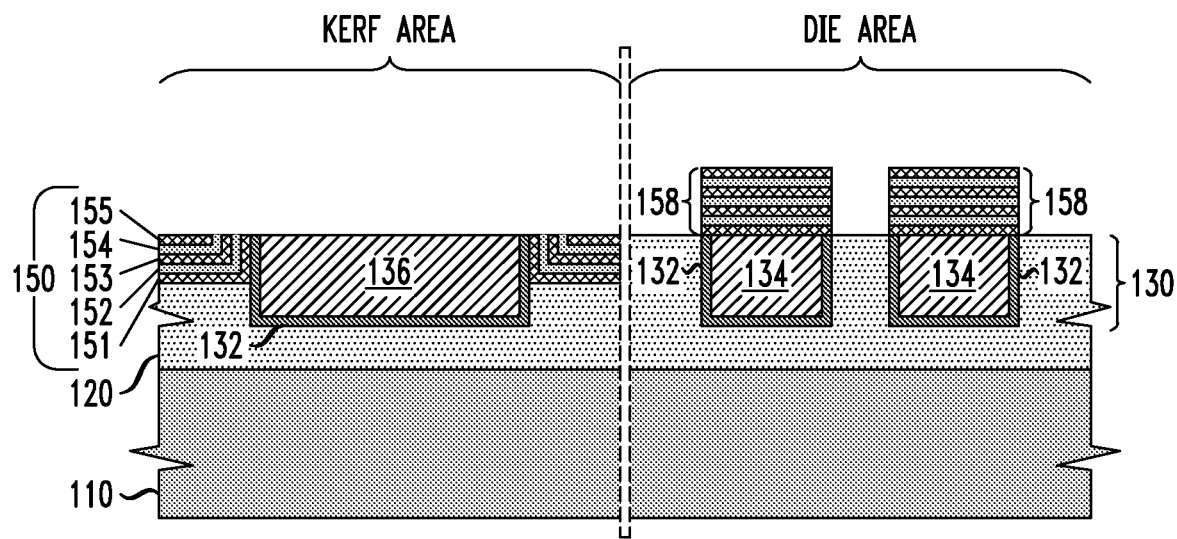

Next, FIG. 11 is a schematic cross-sectional side view of the structure shown in FIG. 10 after patterning the optically opaque layer stack 150 to form device structures 158 in the die area which are aligned to the metallic structures 134. In some embodiments, as noted above, the device structures 158 comprise MTJ structures of MRAM devices. As schematically illustrated in FIG. 11, the optically opaque layer stack 150 is etched down to the upper surface of the ILD layer 120 in the die area. The etching process also results in recessing the optically opaque layer stack 150 down to the upper surface of the metallic alignment structure 136 in the kerf area of the wafer. The exposed portions of the optically opaque layer stack 150 can be etched using RIE or IBE (ion beam etch) techniques.

Figure 12:
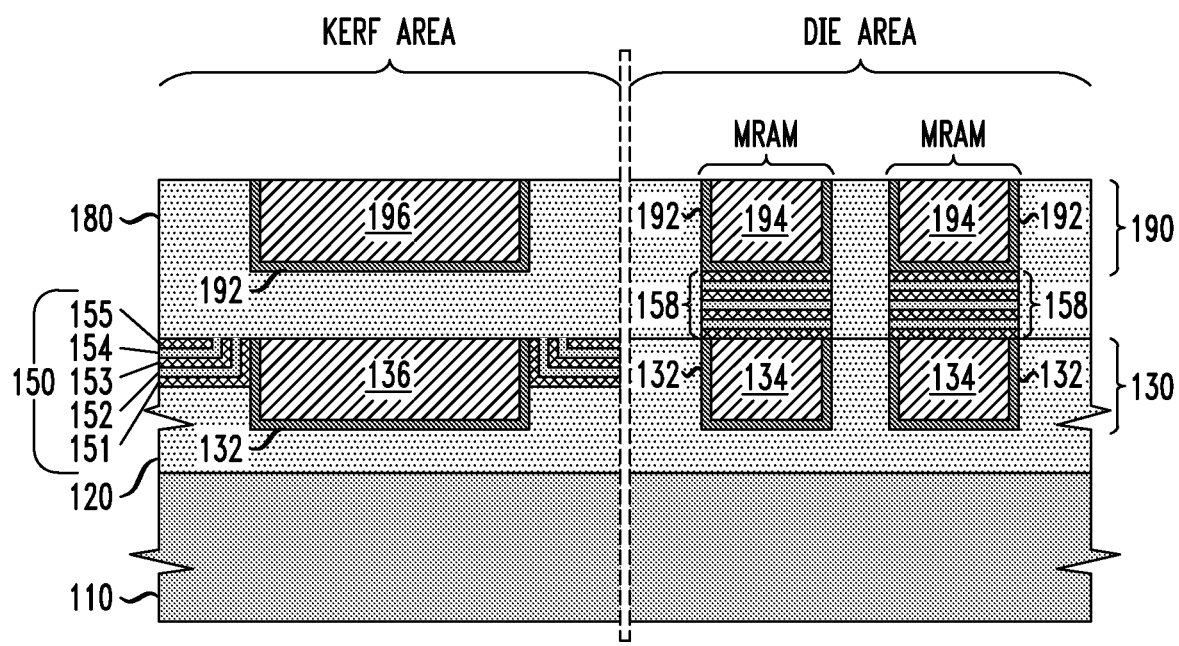

FIG. 12 is a schematic cross-sectional side view of the structure shown in FIG. 11 after forming another level of the BEOL structure comprising a second ILD layer 180, a metallization layer 190 comprising liner layers 192 and metallic structures 194 and 196 formed in die and kerf areas of the wafer 100. In the die area, in some embodiments, the metallic structures 194 comprise metallic wiring and/or via structures that form a BEOL interconnect structure. In other embodiments, the metallic structures 194 comprise upper electrodes of MRAM devices that are formed within the BEOL structure (wherein each MRAM device comprises an MTJ stack 158 disposed between lower and upper electrodes 134 and 194). In the kerf area, the metallic structure 196 comprises a metallic alignment structure which forms part of a mesa alignment structure that is to be formed in the kerf area to enable alignment of one or more lithographic photomasks that are used for patterning a stack of one or more optically opaque layers that subsequently deposited in the die area in another level of the BEOL structure.

Figure 13:
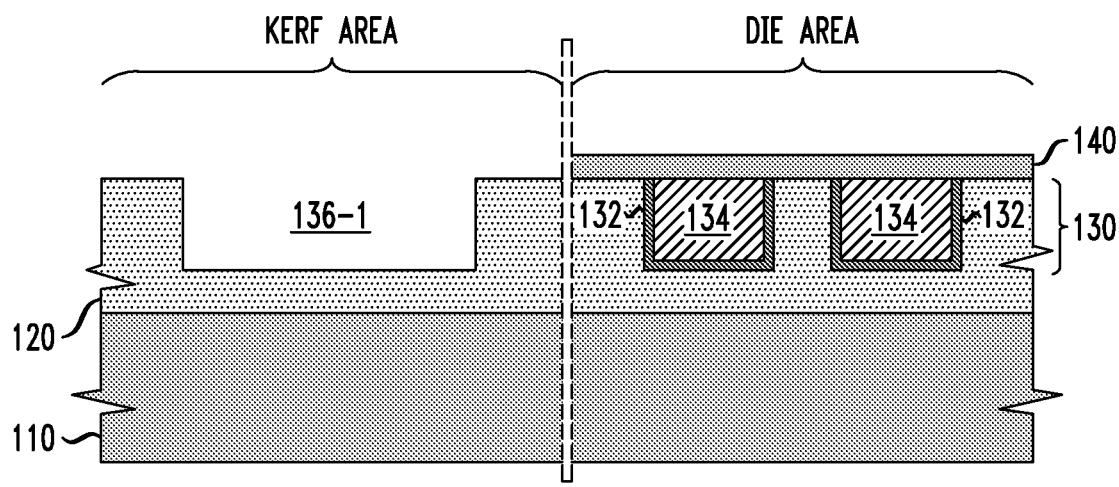
Figure 14:
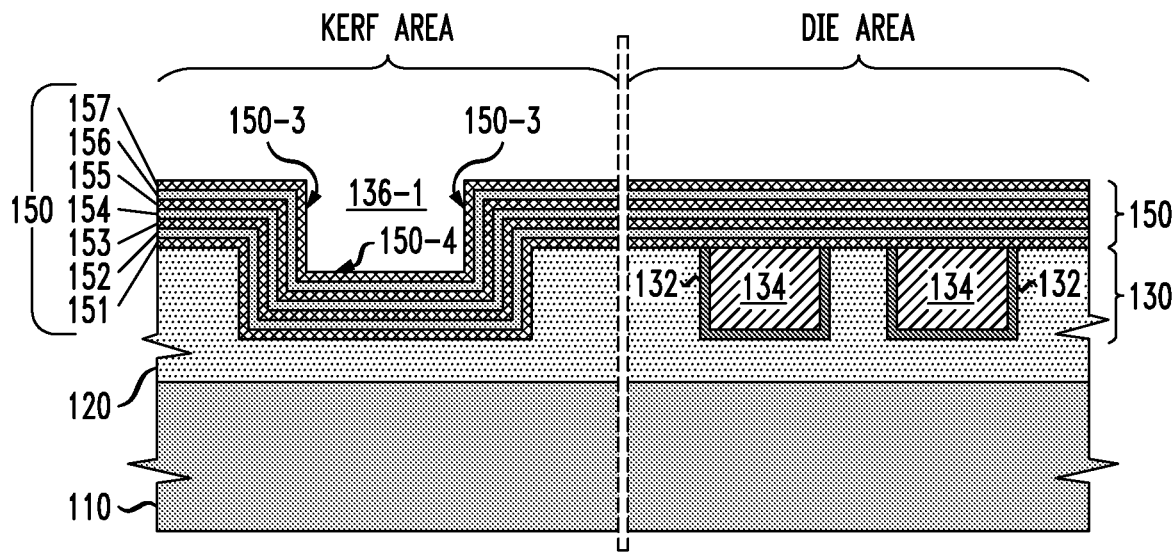

FIGS. 13 and 14 schematically illustrate a method for fabricating optically opaque non-planar alignment structures in non-die areas of a wafer 105 which are utilized to align lithographic photomasks to die areas on the wafer, according to embodiments of the invention. The method of FIGS. 13 and 14 is similar to the methods discussed above in conjunction with FIGS. 2A-12, except that FIGS. 13 and 14 schematically illustrate a method for fabricating optically opaque trench alignment structures in the non-die areas (e.g., kerf areas) of the wafer 105. In particular, FIG. 13 is a schematic cross-sectional side view of the structure shown in FIG. 4 after etching the metallic structure 136 in the kerf area to form a trench 136-1 in the ILD layer 120 in the kerf area. In the exemplary embodiment of FIG. 13, the metallic structure 136 and the liner layer 132 are etched away to form the trench 136-1. In other embodiments, the metallic structure 136 and the liner layer 132 are partially recessed to a target level between the upper surface of the ILD layer 120 and the bottom of the metallic structure 136 to form a trench region above the recessed surface of the metallic structure 136 and liner layer 132.

The metallic structure 136 and the liner layer 132 can be etched/recessed using an anisotropic dry etch process (e.g., ME) with an etch chemistry that is configured to etch the materials of the metallic structures 136 and liner layer 132 selective to the materials which form the ILD layer 120 and the sacrificial dielectric layer 140. With this etch process, the sacrificial dielectric layer 140 protects the metallic structures 134 in the die area from being etched. The etching/recessed of the metallic structure 136 and liner layer 132 in the kerf area serves to create a non-planar surface topography (e.g., a trench topography) in the kerf area of the wafer 105 to enable the formation of an optically opaque trench alignment structure in the kerf area.

In particular, FIG. 14 is a schematic cross-sectional side view of the structure shown in FIG. 13 after removing a remaining portion of the sacrificial dielectric layer 140 and forming a stack of optically opaque layers 150 (or optically opaque layer stack 150) in the kerf and die areas of the wafer 105, which results in the formation of an optically opaque trench alignment structure in the kerf area of the wafer 105. In the exemplary embodiment of FIG. 14, the stack of optically opaque layers 150 is the same or similar to the layers discussed above in conjunction with FIG. 7, the details of which will not be repeated. As schematically illustrated in FIG. 14, the optically opaque trench alignment structure comprises steep sidewall surfaces 150-3 (e.g., vertical sidewalls) and a bottom surface 150-4. Following the formation of the intermediate structure shown in FIG. 14, the process flow continues with the same or similar processing steps as schematically illustrated in FIGS. 8 through 12, the details of which will not be repeated.

The alignment of a lithographic photomask can achieved by aligning features of an alignment pattern of the lithographic photomask to the sidewalls 150-3 of the optically opaque trench alignment structure in the kerf area. The optically opaque trench alignment structure and the alignment pattern of the lithographic photomask can be formed to have any suitable types of shapes and patterns which are sufficient to enable accurate alignment. For example, the optically opaque trench alignment structure may be a rectangular-shaped trench structure, and the alignment pattern of the photomask can be a rectangular-shaped alignment pattern that is shaped to fit within the opening of the optically opaque trench alignment structure when alignment is achieved (e.g., the rectangular-shaped alignment pattern of the photomask being surrounded by the sidewalls 150-3 of the optically opaque trench alignment structure). In other embodiments, the alignment pattern of the photomask may be an X-shaped pattern, a cross-shaped pattern, etc., which is configured to fit within the opening of the optically opaque trench alignment structure to achieve alignment.

It is to be understood that other types of optically opaque non-planar alignment structures can be used, wherein the optically opaque mesa and trench alignment structure are merely exemplary embodiments of optically opaque non-planar alignment structure. In all embodiments, an optically opaque non-planar alignment structure is any alignment structure which comprises an optically opaque step-like topography comprising at least one vertical or tapered sidewall, etc., which can serve as an alignment mark for aligning a photomask to die areas on a wafer when the die areas are covered by optically opaque layer(s) which are to be patterned using the photomask.

It is to be understood that the methods discussed herein for fabricating optically opaque non-planar alignment structures in kerf areas of wafers can be readily incorporated within semiconductor processing flows for fabricating various type of semiconductor IC devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method comprising:
    forming an insulating layer over a surface of a wafer comprising a non-die area and a die area, wherein the insulation layer comprises an inter-layer dielectric layer of a back-end-of-line structure;
    forming metallic features in the insulating layer, wherein the metallic features comprise a metallic device feature formed in the insulating layer in the die area and a metallic mesa alignment feature formed in the insulating layer in the non-die area;
    forming an optically opaque layer stack in the die and non-die areas of the wafer, wherein the optically opaque layer stack comprises at least one conformal layer of optically opaque material which is deposited in the die and non-die areas of the wafer, and which conformally covers the metallic mesa alignment feature to thereby form an optically opaque mesa alignment structure in the non-die area of the wafer; and
    performing a lithographic patterning process to pattern the optically opaque layer stack in the die area, wherein performing the lithographic patterning process comprises utilizing the optically opaque mesa alignment structure in the non-die area to align a lithographic photomask to the die area;
    wherein forming the metallic features in the insulating layer, comprises:
        concurrently forming (i) a metallic alignment feature in the insulating layer in the non-die area of the wafer and (ii) the metallic device feature in the insulating layer in the die area of the wafer; and
        recessing a surface of the insulating layer in the non-die area to a level below an upper surface of the metallic alignment feature in the non-die area to expose an upper portion of the metallic alignment feature and thereby form the metallic mesa alignment feature in the insulating layer in the non-die area of the wafer;
    wherein the optically opaque layer stack formed in the die and non-die areas of the wafer conformally covers the exposed upper portion of the metallic mesa alignment feature to thereby form the optically opaque mesa alignment structure in the non-die area of the wafer.

2. The method of claim 1, wherein recessing the surface of the insulating layer in the non-die area comprises:
    forming a sacrificial layer over the non-die and die areas of the wafer, wherein the sacrificial layer comprises an optically transparent dielectric material;
    patterning the sacrificial layer to form a block mask which covers the insulating layer in the die area and exposes the insulating layer in the non-die area;
    etching the exposed portion of the insulating layer in the non-die area using an etch process with an etch chemistry that is configured to etch the insulating layer selective to the metallic alignment feature.

3. The method of claim 1, wherein the surface of the insulating layer in the non-die area is recessed to a level which is between upper and lower surfaces of the metallic alignment feature.

4. The method of claim 1, wherein performing the lithographic patterning process to pattern the optically opaque layer stack in the die area, comprises:
    forming a lithographic material stack in the non-die and die areas of the wafer, wherein the lithographic material stack comprises a planarizing layer formed over the optically opaque layer stack, and a photoresist layer formed over the planarizing layer;
    aligning an alignment mark formed on the lithographic photomask to the optically opaque mesa alignment structure in the non-die area of the wafer;
    utilizing the aligned lithographic photomask to expose the photoresist layer;
    developing the exposed photoresist layer to form a photoresist mask; and
    performing one or more etch processes to transfer an image of the photoresist mask into the planarizing layer and the optically opaque layer stack.

5. The method of claim 1, wherein the metallic device feature formed in the insulating layer in the die area comprises one or more of metal lines, metal electrodes, and via structures.

6. The method of claim 1, wherein the optically opaque layer stack comprises one or more conformal layers of metallic material and insulating material.

7. The method of claim 1, wherein the surface of the insulating layer in the non-die area is recessed to a level which is substantially coplanar with a lower surface of the metallic alignment feature.

8. The method of claim 1, wherein the surface of the insulating layer in the non-die area is recessed to a level which is below a lower surface of the metallic alignment feature.

9. A method comprising:
forming an insulating layer over a surface of a wafer comprising a non-die area and a die area, wherein the insulation layer comprises an inter-layer dielectric layer of a back-end-of-line structure;
forming metallic features in the insulating layer, wherein the metallic features comprise a metallic electrode formed in the insulating layer in the die area and a metallic mesa alignment feature formed in the insulating layer in the non-die area;
forming an optically opaque layer stack in the die and non-die areas of the wafer, wherein the optically opaque layer stack comprises a plurality of conformal layers of metallic and insulating materials which are deposited in the die and non-die areas of the wafer, and which conformally cover the metallic mesa alignment feature to thereby form an optically opaque mesa alignment structure in the non-die area of the wafer; and
performing a lithographic patterning process to pattern the optically opaque layer stack in the die area to thereby form a magnetic tunnel junction structure which is aligned to the metallic electrode in the insulating layer in the die area;
wherein performing the lithographic patterning process comprises utilizing the optically opaque mesa alignment structure in the non-die area to align a lithographic photomask to the die area; and
wherein forming the metallic features in the insulating layer, comprises:
concurrently forming (i) a metallic alignment feature in the insulating layer in the non-die area of the wafer and (ii) the metallic electrode in the insulating layer in the die area of the wafer; and
recessing a surface of the insulating layer in the non-die area to a level below an upper surface of the metallic alignment feature in the non-die area to expose an upper portion of the metallic alignment feature and thereby form the metallic mesa alignment feature in the insulating layer in the non-die area of the wafer;
wherein the optically opaque layer stack formed in the die and non-die areas of the wafer conformally covers the exposed upper portion of the metallic mesa alignment feature to thereby form the optically opaque mesa alignment structure in the non-die area of the wafer.

10. The method of claim 9, wherein recessing the surface of the insulating layer in the non-die area comprises:
forming a sacrificial layer over the non-die and die areas of the wafer, wherein the sacrificial layer comprises an optically transparent dielectric material;
patterning the sacrificial layer to form a block mask which covers the insulating layer in the die area and exposes the insulating layer in the non-die area;
etching the exposed portion of the insulating layer in the non-die area using an etch process with an etch chemistry that is configured to etch the insulating layer selective to the metallic alignment feature.

11. The method of claim 9, wherein the surface of the insulating layer in the non-die area is recessed to a level which is between upper and lower surfaces of the metallic alignment feature.

12. The method of claim 9, wherein the surface of the insulating layer in the non-die area is recessed to a level which is substantially coplanar with a lower surface of the metallic alignment feature.

13. The method of claim 9, wherein the surface of the insulating layer in the non-die area is recessed to a level which is below a lower surface of the metallic alignment feature.

14. The method of claim 9, wherein performing the lithographic patterning process to pattern the optically opaque layer stack in the die area, comprises:
forming a lithographic material stack in the non-die and die areas of the wafer, wherein the lithographic material stack comprises a planarizing layer formed over the optically opaque layer stack, and a photoresist layer formed over the planarizing layer;
aligning an alignment mark formed on the lithographic photomask to the optically opaque mesa alignment structure in the non-die area of the wafer;
utilizing the aligned lithographic photomask to expose the photoresist layer;
developing the exposed photoresist layer to form a photoresist mask; and
performing one or more etch processes to transfer an image of the photoresist mask into the planarizing layer and the optically opaque layer stack.

15. A device comprising:
an insulating layer disposed over a surface of a wafer comprising a non-die area and a die area, wherein the insulating layer comprises a metallic mesa alignment feature in the non-die area of the wafer and a metallic device feature in the die area of the wafer, wherein the insulation layer comprises an inter-layer dielectric layer of a back-end-of-line structure, and wherein the metallic mesa alignment feature and the metallic device feature are patterned from a same metallization layer of the back-end-of-line structure; and
an optically opaque layer stack disposed over the insulating layer in the die and non-die areas of the wafer, wherein the optically opaque layer stack comprises at least one conformal layer of optically opaque material which conformally covers the die and non-die areas of the wafer, and which conformally covers the metallic mesa alignment feature to form an optically opaque mesa alignment structure in the non-die area of the wafer; and
wherein the optically opaque mesa alignment structure comprises an alignment structure that is configured to enable alignment of a lithographic photomask to the die area of the wafer to lithographically pattern the optically opaque layer stack in the die area of the wafer.

16. The device of claim 15, wherein the optically opaque layer stack comprises a plurality of conformal layers of metallic and insulating materials, which are patterned to form a magnetic tunnel junction structure that is aligned to the metallic device feature in the insulating layer in the die area, wherein the metallic device feature comprises a metallic electrode of the magnetic tunnel junction structure.

* * * * *